United States Patent [19]
Sumino et al.

[11] Patent Number: 6,107,638
[45] Date of Patent: Aug. 22, 2000

[54] SILICON NITRIDE CIRCUIT SUBSTRATE AND SEMICONDUCTOR DEVICE CONTAINING SAME

[75] Inventors: Hiroyasu Sumino, Tokyo; Akihiro Horiguchi; Mitsuo Kasori, both of Kanagawa; Fumio Ueno, Tokyo, all of Japan

[73] Assignee: Kabushiki Kaisha Toshiba, Kawasaki, Japan

[21] Appl. No.: 09/042,453

[22] Filed: Mar. 16, 1998

[30] Foreign Application Priority Data

Mar. 14, 1997 [JP] Japan ................................ 9-060997
Sep. 16, 1997 [JP] Japan ................................ 9-251154

[51] Int. Cl.[7] .................................................. H01L 29/12
[52] U.S. Cl. ......................................... 257/43; 257/629
[58] Field of Search ..................................... 257/629, 43

[56] References Cited

U.S. PATENT DOCUMENTS

| | | | |
|---|---|---|---|
| 4,540,462 | 9/1985 | Mizunoya et al. | 156/630 |
| 5,035,923 | 7/1991 | Sarin | 427/255 |
| 5,280,850 | 1/1994 | Horiguchi et al. | 228/122.1 |
| 5,912,066 | 6/1999 | Takahashi | 428/195 |
| 5,928,768 | 7/1999 | Ikeda et al. | 428/210 |

FOREIGN PATENT DOCUMENTS 7-149588  6/1995  Japan .

OTHER PUBLICATIONS

S. Tanaka et al., Proc. of International Symposium Ceramic Components for Engine pp. 249–256 (1993).

*Primary Examiner*—David Hardy
*Attorney, Agent, or Firm*—Foley & Lardner

[57] ABSTRACT

Disclosed is a silicon nitride circuit substrate, a manufacturing procee thereof, and a semiconductor device therewith. The circuit substrate comprises: a silicon nitride substrate; a metal circuit plate; and a intermediate layer being interposed between the silicon nitride board and the metal circuit plate for joining the silicon nitride substrate and the metal circuit plate, and having a compound containing an aluminum oxide component. The concentration of the aluminum oxide component in the intermediate layer is higher in the side of the metal circuit plate than in the side of the silicon nitride board.

9 Claims, 2 Drawing Sheets

SILICON NITRIDE CIRCUIT SUBSTRATE AND SEMICONDUCTOR DEVICE CONTAINING SAME

BACKGROUND OF THE INVENTION

1. Field of the Invention

This invention relates to a silicon nitride circuit substrate, a process for manufacturing the same, and a semiconductor device using the silicon nitride circuit substrate, and, particularly to a high thermal-conductive silicon nitride circuit substrate which is improved in mechanical strength and heat cycle resistance and which has excellent heat radiation characteristics, a process for manufacturing the same, and a semiconductor device with the same.

2. Related Art

A circuit substrate is manufactured by joining a ceramic substrate with a metal circuit plate. A direct joining process in which a ceramic substrate is directly bound with a metal circuit plate without using a binding material such as a brazing material is known as the joining process. This process comprises a step of producing an eutectic compound either between components contained in the metal circuit plate or between components contained in the metal circuit plate and the ceramic substrate and a step of binding the metal circuit plate with the ceramic substrate using this eutectic compound as a joining material. This joining process is effective in the case of using an oxide ceramic substrate, e.g. alumina. However, in the case where ceramics of a nitride, particularly a silicon nitride ceramic substrate as disclosed in Japanese Patent Application Laid-Open (JP-A) No. 6-135771 is bound with a metal circuit plate, the wettability of the resulting eutectic liquid phase is reduced, which results in reduction of joining strength. Accodingly, if the obtained semiconductor device is started to load a repeat heat cycle on the joint portion, a crack is produced in the ceramic substrate at the position near the joint portion, which causes the circuit substrate to possess a reduced heat cycle resistance. This process is therefore an ineffective means for a nitride ceramic substrate.

The silicon nitride ceramic substrate is, however, a material possessing high thermal conductivity as well as high mechanical strength and thermal resistance. As a method for improving the bond characteristics, therefore, the present inventors have proposed, in Japanese Patent Application Laid-Open (JP-A) No. 7-250318, a measures of utilizing an intermediate layer containing aluminum and oxygen when joining a high thermal-conductive silicon nitride ceramic substrate with a metal circuit plate.

The method proposed in the above Japanese Patent Application Laid-Open (JP-A) No. 7-250318 is excellent in the joining characteristics. There is also a demand for further improving the heat cycle resistance and reliability of the joint portion. The present invention has conducted to produce a more reliable circuit substrate.

SUMMARY OF THE INVENTION

With these problems in mind, therefore, it is the primary object of the present invention to provide a novel silicon nitride circuit substrate, that is, a high thernal-conductive silicon nitride circuit substrate which makes use of the high strength naturally provided with a sintered silicon nitride ceramic substrate, possesses high thernal conductivity and excellent heat radiation characteristics, and is outstandingly improved in heat cycle resistance.

Moreover, another object of the present invention is to provide a semiconductor device which is improved in the reliability in a heat cycle by utilizing the silicon nitride substrate.

In order to achive the above-mentioned object, a silicon nitride circuit substrate according to the present invention comprises: a silicon nitride substrate; a metal circuit plate; and a intermediate layer being interposed between the silicon nitride substrate and the metal circuit plate for joining the silicon nitride substrate and the metal circuit plate, and having a compound containing an aluminum oxide component, in which the concentration of the aluminum oxide component in the intermediate layer is higher in the side of the metal circuit plate than in the side of the silicon nitride board.

In the above construction, preferably, the thickness of the intermediate layer is from 0.5 to 15 $\mu$m and the concentration of an alumina component in the side of the metal circuit plate is 40% by weight or more.

Moreover, in order to achieve the above-mentioned object, a process for manufacturing a silicon nitride circuit substrate in which a silicon nitride substrate and a metal circuit plate are bound each other through an intermediate layer, according to the present invention comprises: forming, on a silicon nitride substrate, the intermediate layer of a material which comprises a compound containing an aluminum oxide component; heating the formed intermediate layer while the intermediate layer is in contact with a solid surface containing aluminum oxide, thereby producing concentration gradient of the aluminum oxide component in the intermediate layer such that is higher in the side of the metal circuit plate than in the side of the silicon nitride ceramic substrate; and binding a metal circuit plate with the intermediate layer by heating the metal circuit plate while the metal circuit plate is in contact with the intermediate layer.

Moreover, the semiconductor device according to the present invention comprises the silicon nitride circuit substrate as described above and a semiconductor element which is mounted on the silicon nitride circuit substrate.

BRIEF DESCRIPTION OF THE DRAWINGS

The features and advantages of the according to the present invention over the proposed conventional art will be more clearly understood from the following description of the preferred embodiments of the present invention taken in conjunction with the accompanying drawings in which like reference numerals designate the same or similar elements or sections throughout the figures thereof and in which.

DETAILED DESCRIPTION OF THE PREFERRED EMBODIMENTS

The present inventors have conducted earnest studies to attain the above objects and, as a result, found that the characteristics of an intermediate layer can be improved by controlling the distribution of aluminum oxide contained in the intermediate layer to invent a silicon nitride circuit substrate, a semiconductor device using the silicon nitride circuit substrate, and a process for manufacturing the silicon nitride circuit substrate.

A layer including a compound containing an aluminum oxide component is formed by a sol-gel process, dipping process, spin coating process, CVD process, or the like on the surface of a sintered silicon nitride ceramic substrate and this layer containing aluminum oxide is subjected to heat treatment to obtain a silicon nitride ceramic substrate on which an intermediate layer including a compound containing aluminum oxide component is formed. At the time of heat treatment, a silica component derived from the silicon nitride ceramic substrate is produced in the aluminum oxide-containing layer and the aluminum oxide component is diffused out from the surface of the aluminum oxide-containing layer. In this situation, the concentration of the aluminum oxide component is the highest in the vicinity of the center of the intermediate layer and is lower at the positions near the ceramic substrate and the surface of the intermediate layer. When such an intermediate layer is in contact with the metal circuit plate to heat the intermediate layer and thereby to join with the metal circuit plate, the joint strength more decreases with a decrease in concentration of aluminum oxide in the surface of the intermediate layer. Also, when a heat cycle operation is performed in which heating and cooling are alternately repeated, the breaking of the intermediate layer and the rupture of the joint portion are caused by distortion due to stress because the metal circuit plate and the ceramic substrate which are bound via the intermediate layer have outstandingly different coefficients of thermal expansion.

However, when the heat treatment of then aluminum oxide-containing layer formed on a ceramic substrate is carried out while the aluminum oxide-containing layer is in contact with alumina brick or the like, the concentration of the aluminum oxide component of the prepared intermediate layer is the highest in the vicinity of the surface which is in contact with the alumina brick and decreases with a decrease in distance from the side facing the ceramic substrate. When a silicon nitride ceramic substrate having such an intermediate layer is bound with a metal circuit plate, the joint strength is improved according to the highness of aluminum oxide component concentration in the vicinity of the bound surface. In addition, since the coefficient of thermal expansion of silica is smaller than that of alumina, the resulting structure, in which the concentration of the silica component is higher in the side facing the ceramic substrate and the concentration of aluminum oxide is higher in the side facing the metal circuit plate, ensures the reduction in distortion due to stress caused by a heat cycle operation whereby the heat cycle resistance and reliability of intermediate layer are improved. The silicon nitride circuit substrate according to the present invention has a structure in which the silicon nitride ceramic substrate and the metal circuit plate are bound via the intermediate layer having the feature of such a concentration distribution of aluminum oxide component.

Firstly, the silicon nitride ceramic substrate is explained.

The present invention is not limited to the use of a silicon nitride ceramic substrate having a high thermal conductivity, however, it is practically desirable to use a high thermal-conductive silicon nitride ceramic substrate having a thermal conductivity of 60 W/mK or more since the availability of high thermal conductivity is one of the advantages of silicon nitride. A silicon nitride ceramic substrate with a thermal conductivity of 60 W/mK or more can be produced, for example, by molding raw mixed powder prepared by adding a prescribed amount of an oxide of a rare earth element to fine silicon nitride powder of high purity, followed by degreasing, by keeping the resulting compact at the prescribed temperature for a specific period of time to sinter the compact, and by gradually cooling the compact at a rate lower than the prescribed cooling rate. Alternatively, silicon nitride raw powder of high purity which is reduced in a content of oxygen and impurity cations is used and sintered to restrain efficiently the production of an amorphous phase in a grain boundary phase and to produce a crystalline compound in the grain boundary phase in an amount of 20% by volume or more (for total volume of the grain boundary phase), thereby producing the objective silicon nitride ceramic substrate. In this case, 50% by volume or more of the crystalline compound is produced to obtain the objective ceramic substrate with a thermal conductivity of 80 W/mK or more. Also, if the cooling rate after sintering is allowed to be 100° C. per hour or less, the grain boundary phase of the silicon nitride sintered body is changed from the amorphous condition to a phase containing much crystalline phase, thereby achieving high strength and thermal conductivity at the same time.

As a preferred embodiment of the silicon nitride ceramic substrate, a high thermal-conductive silicon nitride ceramic substrate is exemplified in which the rare earth element is contained in an amount of 1.0 to 12.5% by weight converted into an oxide; as the impurity cations, Li, Na, K, Fe, Ca, Mg, Sr, Ba, Mn and B are contained in a total amount of equal to or less than 0.3% by weight; and the thermal conductivity is 60 W/mK or more at a temperature lower than 25° C. As another preferred embodiment of the silicon nitride ceramic substrate, a high thermal-conductive silicon nitride ceramic substrate is exemplified which is constructed of silicon nitride particles and a grain boundary phase; and in which a crystalline compound phase in the grain boundary phase is 20% by volume or more for the total grain boundary phase and the thermal conductivity is 60 W/mK or more. An intermediate layer which preferably has a thickness of 0.5 to 15 $\mu$m, contains aluminum oxide, and the content of aluminum oxide is higher in the vicinity of the side facing the metal circuit plate than in the vicinity of the side facing the silicon nitride ceramic substrate is formed on the surface of the silicon nitride ceramic substrate. The metal circuit plate is bound with the silicon nitride ceramic substrate via the intermediate layer to produce a circuit substrate and a semiconductor device.

The silicon nitride ceramic substrate is manufactured, for example, by the following process: Firstly, silicon nitride powder is prepared in which the content of oxygen is 1.7% by weight or less, Li, Na, K, Fe, Ca, Mg, Sr, Ba, Mn, and B are contained in a total amount of less than 0.3% by weight and preferably 0.2% by weight or less as the impurity cations, silicon nitride of an a phase is contained in an amount of 90% by weight or more, and the average grain size is 0.8 $\mu$m or less. To the silicon nitride powder is added a rare earth element as a sintering assistant in an amount of 1.0 to 12.5% by weight converted into an oxide to prepare a raw mixed powder or the like. The raw mixed powder is molded by making use of a binder as required. After the molded compact is degreased, it is sintered at 1,800 to 2,000° C. under a pressurized circumstance and is cooled at a cooling rate of 100° C./hour or less from the above sintering temperature to the temperature at which a liquid phase produced from the above rare earth element in the sintering step solidifies.

In the above manufacturing process, at least one compound selected from the group consisting of oxides, carbonates, nitrides, silicates and borates of Ti, Zr, Hf, V, Nb, Ta, Cr, Mo and W can be further added in an amount of 0.2 to 3.0% by weight to the above raw mixed powder. Further, at least one of alumina ($Al_2O_3$) and aluminum nitride (AlN) can be added in an amount of 0.1 to 2.0% by weight as required.

In the above manufacturing process, a silicon nitride ceramic substrate can be obtained in which a grain boundary phase containing a rare earth element is formed in a structure having a matrix phase of silicon nitride, the porosity is 1.5% by volume or less, the thermal conductivity is 60 W/mK or more, and the three-point bending strength is 60 kgf/mm² or more at room temperature, and which therefore has excellent mechanical characteristics and thermal conductivity.

As the silicon nitride powder which is a major raw material used for the high thermal-conductive silicon nitride ceramic substrate used in the present invention, fine silicon nitride powder is preferably used in which the content of oxygen is 1.7% by weight or less and preferably 0.5 to 15% by weight, Li, Na, K, Fe, Mg, Ca, Sr, Ba, Mn and B are contained in a total amount of 0.3% by weight or less and preferably 0.2% by weight or less as the impurity cations, silicon nitride of an a phase is contained in an amount of 90% by weight or more and preferably 93% by weight or more, and the average grain size is 0.8 μm or less and preferably from 0.4 to 0.6 μm. The use of the fine raw powder with an average grain size of 0.8 μm or less enables the production of a fine sintered body with a porosity of 1.5% by volume or less using even a small amount of a sintering assistant. Also, elements such as Li, Na, K, Fe, Mg, Ca, Sr, Ba, Mn and B inhibit the thermal conductivity as an impurity cation and hence the total amount of the above impurity cations is required to be reduced to 0.3% by weight or less, in order to secure a thermal conductivity of 60 W/mK or more. Further, the use of the silicon nitride raw powder having 90% by weight or more of silicon nitride of an a phase which has more excellent sintering characteristics than those of silicon nitride of a β phase enables a highly dense and thermal-conductive silicon nitride ceramic substrate to be produced.

As the rare earth element added as the sintering aid to the silicon nitride raw powder, Y, La, Sc, Pr, Ce, Nd, Dy, Ho, Gd, Yb or the like can be used in the form of an oxide. These elements can be also used in the form of a compound such as a carbonate, nitrate, oxalate or alkoxide, which is converted into a corresponding oxide of each of these elements by heat treatment. The sintering aids may be added either single or in combination of two or more, and preferably, yttrium oxide ($Y_2O_3$) is used. These sintering additives react with the silicon nitride raw powder in the sintering step to produce a liquid phase and thereby to promote sintering. The amount of the above sintering additives to be added is designed to be in a range of 1.0 to 12.5% by weight converted into an oxide for the amount of raw powder. If the amount is less than 1.0% by weight, an effect of promoting sintering is insufficiently produced whereas if the amount exceeds 12.5% by weight, a grain boundary phase is excessively created, which tends to cause reductions in thermal conductivity and mechanical strength. Preferably, an amount in a range of 3.0 to 6.0% by weight is desired.

Furthermore, if at least one of alumina ($Al_2O_3$) and aluminum nitride (AlN) is added as other additional components, these compounds react with the above rare earth element to produce a liquid phase, with achieving an effect on the promotion of sintering and a significant effect especially in the case of performing pressure sintering. If the total amount of these compounds is less than 0.1% by weight, only insufficient density is obtained. On the other hand, if the amount exceeds 2.0% by weight, a grain boundary phase is excessively created or a part of aluminum atoms starts to dissolve in the silicon nitride particles, which causes the reduction in thermal conductivity. Therefore, the amount of these compounds is from 0.1 to 2.0% by weight and preferably from 0.2 to 1.5% by weight.

Oxides, carbides, silicides and borides of Ti, Zr, Hf, V, Nb, Ta, Cr, Mo and W used as the other additional component have a function of promoting the dispersion in a crystal structure to improve the mechanical strength of the silicon nitride ceramic substrate. If the amount of the above compound is less than 0.2% by weight, only insufficient effect on the improvement of the strength is obtained. On the other hand, an amount exceeding 3.0% by weight leads to reduction in thermal conductivity and dielectric breakdown strength. Therefore, the amount of additional component of the above compound is from 0.2 to 3.0% by weight and preferably from 0.3 to 2.0% by weight.

In addition, the compounds of the above Ti, Zr, Hf or the like function as a light shielding material which color the silicon nitride ceramic substrate to provide the board with semitransparency. In general, it is desirable to add the above compound in the case where the circuit substrate of the present invention is applied to a circuit substrate provided with an integrated circuit which tends to produce malfunction caused by light.

Since the grain boundary phase formed in the silicon nitride sintered body greatly affects the thermal conductivity of the silicon nitride ceramic substrate, it is important to design that 20% by volume or more of the grain boundary phase is occupied by a crystalline phase, in order to obtain a high thermal-conductive silicon nitride ceramic substrate.

In order to design the porosity of the silicon nitride ceramic substrate to be 1.5% by volume or less so that 20% by volume or more of the grain boundary phase formed in the silicon nitride sintered body is occupied by a crystalline phase, it is important to sinter the silicon nitride molded compact under pressure at 1,800 to 2,000° C. for 0.5 to 10 hours and to arrange and control a cooling rate of 100° C./hour and preferably 50° C./hour or less after the completion of the sintering process. If the sintering temperature is designed to be less than 1,800° C., the density of the sintered body is insufficient thereby reducing the mechanical strength and the thermal conductivity. On the other hand, a sintering temperature exceeding 2,000° C. is undesirable since it causes violent decomposition and vaporization of silicon nitride.

The cooling rate after the sintering is an important factor to crystallize the grain boundary phase and thereby to impart high mechanical strength and thermal conductivity. Rapid cooling at a cooling rate exceeding 100° C./hour causes an increase in proportion of an amorphous phase in the grain boundary phase included in the sintered body, leading to a reduction in strength and thermal conductivity.

The range of temperature in which the above cooling rate must be strictly controlled is from the sintering temperature (1,800 to 2,000° C.) to a temperature at which the liquid phase produced by the reaction of the above sintering aid is solidified. For example, the liquid phase-solidified temperature in the case of using the above sintering aid is around 1,500 to 1,600° C. In the case where the cooling rate in temperatures ranging from the sintering temperature to the liquid phase-solidified temperature is controlled at a rate of 100° C./hour or less and preferably 50° C. or less, 20% by volume or more of and preferably 50% by volume or more of the grain boundary phase is converted into a crystalline phase. As a result, tt is possible to obtain a silicon nitride ceramic substrate having excellent mechanical strength and thermal conductivity.

Putting together the above descriptions, a preferred embodiment of the process for manufacturing a high thermal-conductive silicon nitride ceramic substrate is as follows: First, adequate amounts of necessary additives such as a sintering aid, organic binder and the like are added to the above silicon nitride powder which has a micro-grain size and a small amount of impurities and mixed to prepare raw mixed powder. Then, the resulting raw mixed powder is molded using a general sheet molding method, e.g. a metal molding method, doctor-blade method, to prepare a green compact with a desired shape. The green compact is degreased by heating it up to a temperature of 600 to 800° C. maximum under a non-oxidizing atmosphere. The degreased compact is sintered at a temperature of 1,800 to 2,000° C. under an atmosphere of an inert gas, e.g. nitrogen, argon, under pressure. The sintered compact is, as required, subjected to a grinding process, machining process and the like.

The high thermal-conductive silicon nitride substrate manufactured according to the above processes has a porosity of 1.5% by volume or less and a thermal conductivity as high as 60 W/mK (at 25° C.). The silicon nitride substrate also has a three-point bending strength of 60 kgf/mm$^2$ or more, exhibiting excellent mechanical strength. If a more appropriate process condition is selected, the strength can be increased to 80 kgf/mm$^2$ or more.

Next, the intermediate layer of the present invention including a compound containing an aluminum oxide component is described below.

Examples of the compound containing aluminum oxide component include compounds such as a simple substance of alumina ($Al_2O_3$), aluminosilicate ($Al_2O_3$–$SiO_2$) represented by mullite, rare earth aluminate and the like. Among these compounds, alumina is especially preferable. An amorphous phase such as glass containing aluminum and oxygen may also be used. Further, plural kinds of compounds may be included in the intermediate layer. It is noted that one having a crystal phase is better to obtain a higher binding strength due to the matching of the crystal lattice between the intermediate layer and the silicon nitride substrate. Aluminum and oxygen contained in these compounds serves to improve the wettability of an eutectic liquid phase of a metal circuit substrate produced in the heat treatment for binding and, at the same time, react with the eutectic liquid phase to produce a M-Al-O compound (M represents a metal element forming a metal circuit plate) between the metal circuit plate and the intermediate layer. The production of this M-Al-O compound enables the metal circuit plate and the intermediate layer to be firmly bound and, further, the intermediate layer is firmly secured to the silicon nitride ceramic substrate. As a result, the metal circuit plate can be firmly bound with the silicon nitride ceramic substrate. Particularly in the case where aluminum is a major component of the metal circuit plate, aluminum contained in the metal circuit plate and aluminum contained in the intermediate layer are mutually diffused whereby more firm binding can be attained.

The compound containing aluminum oxide component in a form of film or the like can be provided by means of various processes on the surface of the silicon nitride ceramic substrate after sintering. These processes include a process in which a uniform coating of a precursor of that compound is formed by a sol-gel process, dipping process, spin coating process or the like and the precursor is then converted; and a process in which a coating of that compound is formed by CVD, PVD or the like. If the coating of the compound containing aluminum oxide is laminated on the surface of the silicon nitride ceramic substrate using each of these processes, the laminated coating is then heat-treated to form an intermediate layer to be used for joining. In a case of using a glass containing aluminum or the like, a method may be used in which fine powder of such a material is applied to the surface of the silicon nitride ceramic substrate and heated to its melting point to melt.

In order to produce the above-mentioned concentration gradient of an aluminum oxide component in the intermediate layer including the compound containing an aluminum oxide component, there is a method in which the silicon nitride ceramic substrate on which a layer of the compound containing aluminum oxide component is formed is put into contact with a ceramic material containing an aluminum oxide component in a form of a brick or the like, and is heat-treated at a high temperature under an atmosphere involving oxygen for a prescribed period of time. When the heat treatment is carried out in the condition where the intermediate layer is being in contact with such a solid surface containing an aluminum oxide component in this manner, the vaporization of an aluminum oxide component from the surface of the layer of the compound in the heat treatment can be intentionally prevented. In this condition, an aluminum oxide component of the ceramic material can, however, be diffused into the intermediate layer. There is no special limitations to the ceramic material used in the heat treatment to the extent that it is a compound containing an aluminum oxide component, though ceramic materials containing 60% by weight or more of alumina ($Al_2O_3$) are preferably used. On the other hand, in the side close to the silicon nitride ceramic substrate, a part of silicon nitride is oxidized to produce silicon oxide ($SiO_2$) and silicon oxide reacts with aluminum oxide to produce a portion in which the concentration of $SiO_2$ is relatively high whereby the concentration of aluminum oxide is relatively reduced by the heat treatment performed under an atmosphere involving oxygen. In the heat treatment carried out in this manner, a concentration gradient can be produced in which the concentration of aluminum oxide is higher in the side of the intermediate layer which is to be combined with the metal circuit plate in the succeeding step and lower in the side facing the silicon nitride ceramic substrate. The heat treating temperature is designed to be preferably from 800 to 1,800° C. and more preferably from 1,000 to 1,600° C. If the temperature is 800° C. or less, only insufficient adhesive strength can be obtained between the intermediate layer and the silicon nitride circuit substrate. On the other hand, if the heat treatment is performed at temperatures higher than 1,800° C., it is difficult to control the production of $SiO_2$ and, at the same time, bubble occurs inside the intermediate layer due to generation of vapor associated with the decomposition of silicon nitride, leading to a reduction in adhesive strength when the metal circuit plate is bound.

It is desirable to adopt gradual cooling in the cooling step after the heat treatment. It is because such a cooling operation helps to release the stress and a crystal phase tends to produce.

The formation of the intermediate layer having such a concentration gradient produces the following effects: Specifically, the metal circuit plate has a coefficient of thermal expansion higher than that of the silicon nitride ceramic substrate. In the side being contact with the metal circuit plate having a relatively high thermal expansion coefficient, the intermediate layer contains a relatively large amount of aluminum oxide having a relatively high coefficient of thermal expansion (a thermal expansion coefficient: $8 \times 10^{-6}/°C$.). On the other hand, in the side facing the silicon nitride ceramic substrate having a relatively low thermal expansion coefficient, the concentration of $SiO_2$ having a relatively low thermal expansion coefficient (a coefficient of thermal expansion: $3 \times 10^{-6}/°C$.) is high. In such a structure, comparing with the case where the intermediate layer has no concentration gradient of aluminum oxide, thermal stress caused by the expansion and shrinkage associated with heat generated by the heat treatment for the binding of the metal circuit plate or driving of elements after the elements are mounted can be reduced. Also, in the structure of the intermediate layer in which the coefficient of thermal expansion increases with an increase in distance from the silicon nitride ceramic substrate, compressive stress acts on the silicon nitride ceramic substrate which has been processed in heat treatment for forming the intermediate layer and in the succeeding cooling step. In general, it is known that the mechanical strength of a ceramic material is increased by compressive stress. Similarly, in the present invention, the mechanical strength which the ceramic substrate naturally possesses can be more improved.

As a secondary effect, the silicon nitride ceramic substrate is contacted with the ceramic material or sandwiched between the ceramic materials containing aluminum oxide whereby warpage or waviness caused by thermal stress applied to the silicon nitride ceramic substrate provided with the intermediate layer can be restrained. If warpage or waviness occurs in a heat treating step, a gap occurs between the metal circuit plate and the silicon nitride ceramic substrate in the subsequent step of binding the metal circuit plate and hence firm bonding can not be attained, resulting in a reduction in reliability of a circuit substrate.

The thickness of the intermediate layer is designed to be preferably from 0.5 to 15 $\mu$m, and more preferably from 1 to 10 $\mu$m. If the thickness of the intermediate layer is less than 0.5 $\mu$m, the effect on improvement in the wettability of the aforementioned eutectic liquid phase is insufficient. On the other hand, if the thickness of the intermediate layer exceeds 15 $\mu$m, this layer causes thermal resistance which impairs the high thermal conductivity of the silicon nitride ceramic substrate. It is also difficult to reduce the difference in coefficients of thermal expansion between the intermediate layer and the silicon nitride ceramic substrate. Accordingly, there is the possibility that the intermediate layer will be peeled off caused by the heat generated in the running of elements.

There is the case where the intermediate layer produced by forming the aluminum oxide-containing layer on the silicon nitride ceramic substrate and by heat treatment is reduced in binding strength with the silicon nitride ceramic substrate depending on the heating time and the atmosphere in heat treatment. Accordingly, when a ceramic circuit substrate which is produced by binding a metal circuit plate with such a silicon nitride ceramic substrate is used, stress applied to it may cause peeling of the metal circuit plate from the ceramic substrate, leading to a reduction in reliability.

In this case, if titanium (Ti) is allowed to exist at the boundary between the aluminum oxide-containing intermediate layer and the silicon nitride ceramic substrate, the adhesive strength between the intermediate layer and the silicon nitride ceramic substrate can be improved. Titanium which is a sort of activated metal partially reacts with aluminum (Al) contained in the intermediate layer containing an aluminum oxide component to produce Ti-Al compounds, e.g. $TiAl_3$, or to produce $Ti_2AlN$ and the like in a microregion when heat treatment is performed under a nitrogen atmosphere. While, silicon (Si) contained in the ceramic substrate reacts with titanium between the intermediate layer and the silicon nitride ceramic substrate to produce Ti-Si compounds (for example, $Ti_5Si_3$) microscopically. As a result, the existence of titanium ensures an significant improvement in adhesive strength between the intermediate layer and the silicon nitride ceramic substrate.

Alternatively, if a relatively large amount nitrogen is allowed to exist at the boundary between the aluminum oxide-containing layer and the silicon nitride ceramic substrate, the binding strength between the intermediate layer and the silicon nitride ceramic substrate can be improved. Nitrogen is also contained in the ceramic substrate as a base. If, in the intermediate layer, a large amount of nitrogen is contained in the side close to the silicon nitride ceramic substrate, the difference in the concentration distributions of nitrogen between the intermediate layer and the silicon nitride ceramic substrate is reduced whereby the binding strengths of the both are increased and hence the adhesive strength between the intermediate layer and the silicon nitride ceramic substrate can be significantly improved.

In the case where titanium is present in the boundary of the silicon nitride circuit plate, such an intermediate layer can be obtained by providing in advance a titanium-containing compound on the surface of the silicon nitride circuit substrate before forming the layer of the aluminum oxide-containing compound on the surface of the silicon nitride circuit substrate, and by heat-treating after the layer of the aluminum oxide-containing compound is formed.

There are no special limitations to the aforementioned titanium compound to the extent that it can react at the microlevel with both the aluminum oxide component contained in the intermediate layer and silicon contained in the silicon nitride circuit plate in the heat treatment for forming the intermediate layer used for binding. A single substance of titanium, titanium oxide, titanium alkoxide, and carbonates, nitrides, oxalates and chlorides of titanium can be used.

The compound containing titanium can be provided by various processes on the surface of the baked silicon nitride ceramic substrate. These processes include a process for forming a uniform film of a precursor of the that compound using a sol-gel process, dipping process, spin coating process or the like in the case of using a solution; and process for forming that compound using a CVD process, PVD process or the like. The titanium compound to be formed has a thickness of 0.01 to 5 $\mu$m and preferably 0.03 to 3 $\mu$m.

The aforementioned titanium of the intermediate layer is permitted to have a concentration distribution. The concentration of titanium in the intermediate layer is relatively high in the vicinity of the silicon nitride circuit plate and relatively low in the vicinity of the metal circuit plate since titanium is diffused toward the inside of the intermediate layer by the above heat treatment for forming the intermediate layer.

In the case where nitrogen is allowed to exist in the intermediate layer at the boundary between the intermediate layer and the silicon nitride circuit plate, the following process may be adopted: In order to allow nitrogen to exist in the intermediate layer at the boundary between the intermediate layer and the silicon nitride circuit plate, a precursor of a nitrogen compound, such as nitride or oxinitride, which is stable at a high temperature is formed in advance on the surface of the silicon nitride circuit plate and is heat-treated after the compound containing aluminum oxide is provided. Alternatively, the compound containing aluminum oxide is provided on the silicon nitride ceramic substrate and is then heat-treated to diffuse nitrogen from the silicon nitride ceramic substrate toward the intermediate layer.

The above nitrogen compound which is stable at a high temperature can be formed by various processes on the surface of the sintered silicon nitride ceramic substrate. These processes include a process in which a uniform coating of a precursor of that compound is formed by a sol-gel process, dipping process, spin coating process or the like in the case of using a solution; and a process in which that compound is formed by CVD, PVD, or the like. In order to diffuse nitrogen from the silicon nitride ceramic substrate toward the inside of the intermediate layer by high temperature-heat treatment and thereby to improve the adhesion between the intermediate layer and the silicon nitride ceramic substrate and to produce the concentration gradient of an aluminum oxide component in the inside of the intermediate layer, it is desirable to perform the heat treatment at temperatures higher than 1,400° C. and lower than the temperature for sintering the silicon nitride ceramic substrate. In this case, it is desirable to perform the heat treatment under a nitrogen atmosphere involving 20% by volume or less of oxygen. A greater oxygen content is undesirable since it causes the decomposition of the silicon nitride ceramic substrate to start because the heat treatment temperature is as high as 1,400° C. or more.

The intermediate layer is permitted to have a concentration distribution of nitrogen. As for the concentration distribution of nitrogen, the content of nitrogen in the intermediate layer is relatively high in the vicinity of the silicon nitride circuit plate and low in the vicinity of the metal circuit plate since nitrogen is diffused toward the inside of the intermediate layer by the above heat treatment for forming the intermediate layer.

Next, the metal circuit plate which can be used in the present invention will be explained.

There are no limitations to a metal composing a metal circuit plate to the extent that it is a substance which can produce an eutectic liquid phase by heating and can be bound. Such a substance includes single substances, oxygen-containing substances, and alloys of copper (Cu), aluminum (Al), iron (Fe), nickel (Ni), chromium (Cr), silver (Ag) and cobalt (Co). Particularly, in view of electrical conductivity and price, Cu, Al and Ni (including those containing a certain amount of oxygen) and alloys of these metals are desirable. Binding of the metal circuit plate is performed by the following process when the metal circuit plate is made of a copper.

Figure 1:
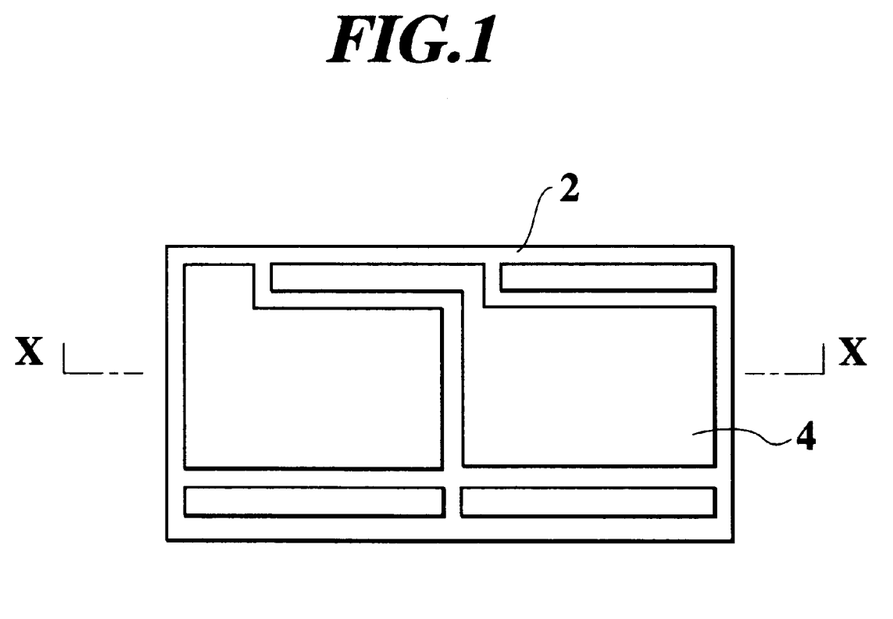
FIG. 1 is a top plan view of an embodiment of a silicon nitride circuit substrate according to the present invention.
Figure 2:
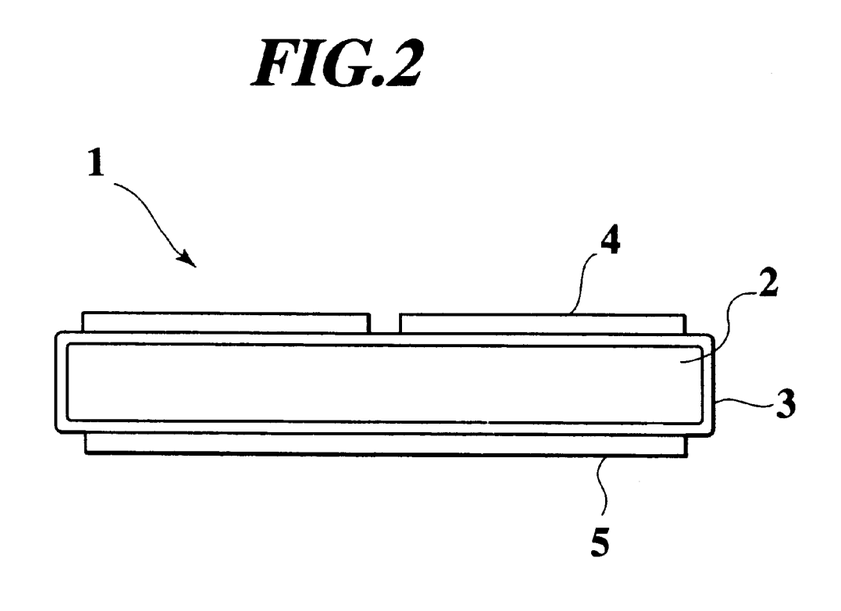
FIG. 2 is a sectional view taken along the line X—X of the silicon nitride circuit substrate of FIG. 1.

First, as shown in FIGS. 1 and 2, metal (copper) substrates 4, 5 are disposed in contact with the prescribed position of the surface of a silicon nitride ceramic substrate 2 on which an intermediate layer 3 including a compound containing an aluminum oxide component is formed with a desired thickness. The ceramic substrate is heated to a temperature higher than the eutectic temperature (1,065° C.) of copper and copper oxide ($CU_2O$) and, as required, under load. The heating is continued for the prescribed period of time to produce an eutectic liquid phase, which acts as a binder for binding the metal circuit plates 4, 5 with the silicon nitride ceramic substrate 2 to form a silicon nitride circuit substrate 1. Other types of metal circuit plate can be fundamentally bound in the same process. In this case, it is necessary to design appropriately the heat treating temperature in consideration of the temperature at which this eutectic liquid phase is produced.

Figure 3:
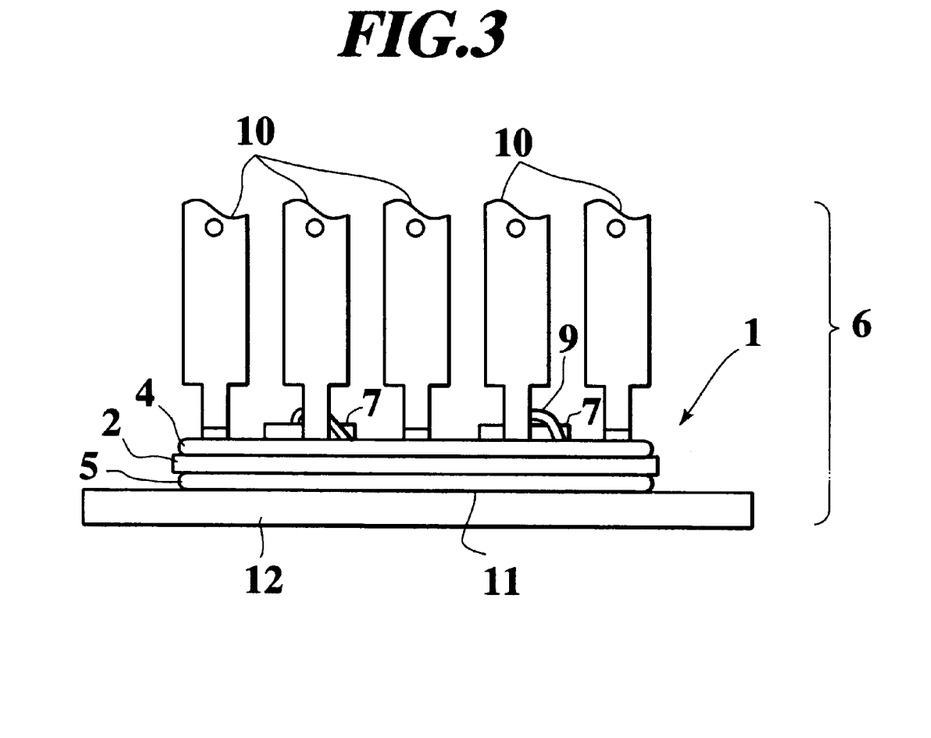
FIG. 3 is a sectional view showing an embodiment of a semiconductor device using the silicon nitride circuit substrate according to the present invention.
Figure 4:
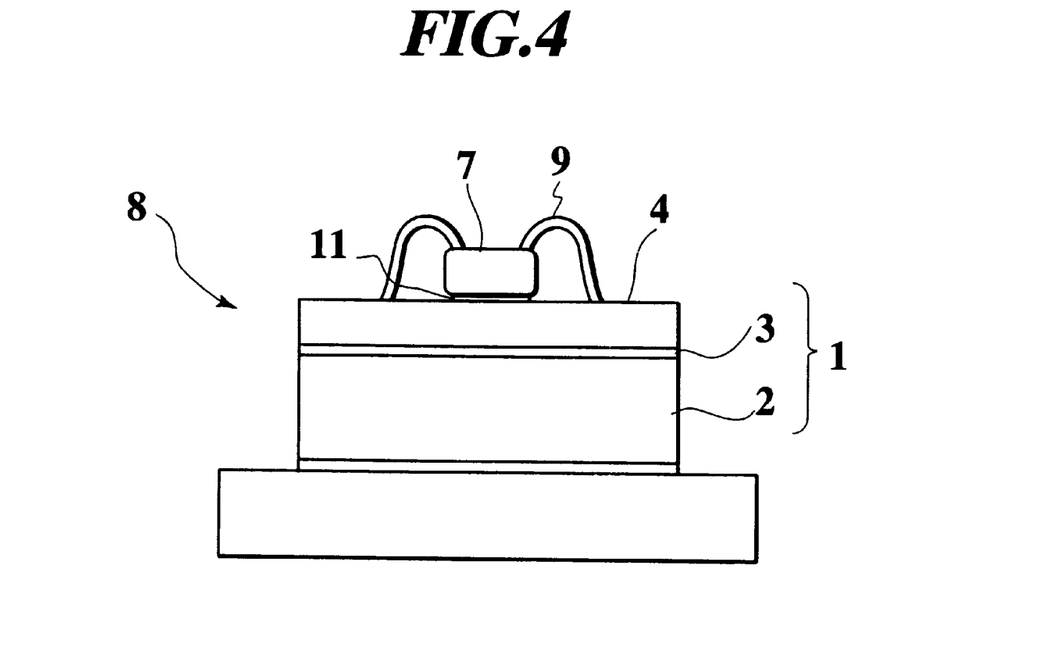
FIG. 4 is a sectional view showing another embodiment of a semiconductor device using the silicon nitride circuit substrate according to the present invention.

Furthermore, as shown in FIGS. 3 and 4, a semiconductor element 7 is mounted on the above silicon nitride circuit substrate 1 to manufacture semiconductor devices 6 and 8. Particularly making use of the high thermal conductivity of the circuit substrate, a semiconductor device on which semiconductor elements with high output power are mounted can be manufactured in an efficient manner. As such a semiconductor device, those called "power module", on which a bipolar transistor, IGBT, GTR, and the like are mounted, are typified. In FIGS. 3 and 4, the reference numerals 9, 10, 11, 12 represent a bonding wire, a take-off lead terminal, a solder and a copper base plate, respectively. The semiconductor device like the above can be primarily used in fields of various motor controls, large power switching and the like. Semiconductor devices used in these fields are accompanied by a heat cycle including repeated heating and cooling associated with the driving and suspension thereof. However, the semiconductor device of the present invention can sufficiently cope with this heat cycle by virtue of the high strength, excellent thermal conductivity, and high reliability of the aforementioned silicon nitride circuit substrate. Further, the silicon nitride circuit substrate can be applied to packages for carrying semiconductor elements.

The present invention will be explained in more detail by way of examples, which are described to make it easy to understanding the present invention, and are not intended to be limiting of the present invention.

EXAMPLE

Example 1

To silicon nitride raw powder having an average grain size of 0.6 μm and containing 1.2% by weight of oxygen, 0.2% by weight of an impurity cation and 96% by weight of α phase-type silicon nitride were added yttrium oxide powder ($Y_2O_3$) having an average grain size of 0.8 μm as a sintering assistant and alumina powder ($Al_2S_3$) having an average grain size of 0.6 μm in amounts of 4% by weight and 1.2% by weight respectively for the total amount and mixed in a wet condition in butanol for 24 hours. The mixture was dried to prepare a raw powder mixture. An organic binder was added to the prepared raw powder mixture and mixed. Then, the resulting mixture was press-molded under a pressure of 1 t/cm$^2$ to prepare a molded compact of 80×50×0.9 mm$^3$. Next, the resulting molded compact was degreased at a temperature of 700° C. maximum under a nitrogen atmosphere. Then, the degreased compact was sintered at 1,880° C. under a nitrogen atmosphere and a pressure of 8 atoms for 8 hours and successively cooled to 1,500° C. at a cooling rate of 100° C./hour, followed by furnace cooling to produce a highly densified silicon nitride sintered body. The sintered body was subjected to a grinding process to obtain a silicon nitride ceramic substrate with a thickness of 0.6 mm.

Next, an intermediate layer for binding was manufactured by the following process: First, hot water raised to 75° C. was charged into aluminum butoxide and vigorously stirred for 25 minutes. To this solution was added nitric acid ($HNO_3$) to obtain a semitransparent sol. After water was removed by evaporation until the volume of this liquid was reduced by half, 2-butanol was finally added to the liquid to produce a coating solution. The aforementioned silicon nitride ceramic substrate was dipped in this coating solution and was slowly lifted at a rate of 5 cm/minute to finish the dipping in the solution, followed by air-drying. Next, this ceramic substrate was sandwiched between bricks containing 98% by weight of alumina, was placed in an electric furnace, and was heated in air at 1,400° C. for 2 hours to manufacture a silicon nitride ceramic substrate on which an intermediate layer having a thickness of 4 μm and being composed of an amorphous phase, an aluminosilicate ($Al_2O_3$–$SiO_2$) crystalline phase, a cristobalite ($SiO_2$) phase, etc. was formed. The content of alumina contained in the intermediate layer which was analyzed by Auger analysis was 85% by weight in the vicinity of the surface and the content of $SiO_2$ increased with an increase in distance from the surface of the intermediate layer so that the content of alumina was 11% by weight in the vicinity of the silicon nitride ceramic substrate.

Next, a copper circuit plate made of tough pitch copper with a thickness of 0.3 mm was disposed on both surfaces of the silicon nitride ceramic substrate on which the intermediate layer was formed. The ceramic substrate was placed in a belt-type furnace and was heated at a temperature of 1,075° C. maximum under a nitrogen atmosphere for one minute to bind the copper circuit plate with the silicon nitride ceramic substrate and thereby to manufacture a high thermal-conductive silicon nitride circuit substrate shown in FIG. 1.

The thermal conductivity of the manufactured silicon nitride ceramic substrate was measured. As a result, the thermal conductivity was 82 W/mK. The porosity of the silicon nitride ceramic substrate was 0.2% by volume. The proportion of a crystalline phase in a grain boundary phase of the inside of the silicon nitride ceramic substrate, which was measured by a powder X ray diffraction method, was 33% by volume.

In order to evaluate the mechanical strength and toughness, the manufactured circuit substrate was subjected to measurement of the three-point bending strength and the maximum deflection. The above circuit substrate was supported with a 50 mm support span. In this condition, load was applied to the center of the circuit substrate to measure the height of deflection at the time when the circuit substrate was broken. The height of deflection at this time was defined as a maximum deflection. As a result, the three-point bending strength was 78 kgf/mm$^2$ and the maximum deflection was 1.3 mm.

A peeling strength test was performed to evaluate the adhesive strength as the binding strength between the circuit plate made of copper and the silicon nitride ceramic substrate. In the peeling strength test, a tough pitch copper board of 0.3 mm thickness and 3mm width was bound with a silicon nitride ceramic substrate on which an intermediate layer was formed in the procedure as above and the end of the tough pitch copper board was peeled off in an upper direction at a right angle to the ceramic substrate using an instolon tester to measure the peeling strength. At this time, the cross head speed was 50 mm/minute. As a result, the peeling strength was 9.2 kgf/cm, showing a sufficient adhesive strength.

Further, the circuit substrate was subjected to a heat cycle resistance test in which it was heated from −45° C. up to room temperature and successively from room temperature to 125° C., and was cooled to −45° C. in one cycle and this cycle was repeated. The number of cycles at the time when any crack occurred in the substrate was measured but no crack was observed even after 1,000 cycles.

Also, a plurality of semiconductor elements was mounted on the high thermal-conductive silicon nitride circuit substrate to manufacture a semiconductor device as shown in FIG. 3. This semiconductor device was energized to measure the transient heat resistance. As a result, this semiconductor device exhibited the same heat radiation characteristics as those of a semiconductor device using a conventional aluminum nitride substrate. Also, there was no occurrence of cracks in the inside of the silicon nitride substrate and the joint portion with the copper board. Thus, excellent durability and reliability were confirmed.

Example 2

After steps up to the step for sintering silicon nitride were performed in the same manner as in Example 1, the cooling was carried out by furnace cooling without controlling the cooling rate to prepare a densified silicon nitride sintered body having a thermal conductivity of 39 W/mK. The cooling rate in this step was about 500° C./hour in average. After this, in the same manner as in Example 1, a surface layer containing alumina ($Al_2O_3$) was formed, heat treatment was carried out, and a copper board was bound to manufacture a circuit substrate. The three-point bending strength and the maximum deflection were 62 kgf/mm$^2$ and 1.2 mm respectively. In the heat cycle resistance test, no crack occurred in the substrate even after 1,000 cycles.

Example 3

Using the same silicon nitride raw powder as in Example 1, 4% by weight of holmium oxide ($Ho_2O_3$) having an average grain size of 0.9 μm as a sintering additive and 0.6% by weight of alumina powder ($Al_2O_3$) having an average grain size of 0.6 μm were added to the raw powder and molding and degreasing were performed in the same manner as in Example 1. Then, the degreased compact was sintered at 1,880° C. under a nitrogen atmosphere and a pressure of 8 atoms for 5 hours. After the sintering, the sintered compact was cooled to 1,500° C. at a cooling rate of 50° C./hour, followed by furnace cooling to room temperature to produce a highly densified silicon nitride sintered body. The sintered body was subjected to a grinding process to obtain a silicon nitride ceramic substrate with a thickness of 0.5 mm.

The obtained silicon nitride ceramic substrate had a porosity of 0.2% by volume. The proportion of a crystal phase in a grain boundary phase was 55% by volume. The thermal conductivity was as high as 91 W/mK.

Next, an intermediate layer for binding a metal circuit plate was prepared by the following process. First, ethyl orthosilicate ($Si(OEt)_4$) was dissolved in ethanol used as a solvent. To the mixed solution was added dropwise a mixture prepared by adding water and nitric acid ($HNO_3$) to ethanol, and the resulting solution was refluxed. A solution in which water is dissolved in ethanol was added to the refluxed solution and aluminum isopropoxide (Al(iso-PrO)$_3$) was further added. Then, the obtained solution was refluxed again. To the solution was added dropwise a liquid which was obtained by diluting concentrated hydrochloric acid in a solvent. The resulting solution was stirred and refluxed to prepare a coating solution. Dropping the coating solution, a coating was formed on the surface of the silicon nitride ceramic substrate by spin coating, and the coating was dried. Next, using a solution of aluminum butoxide used in Example 1, a coating was laminated again by spin coating. After this two coating layers were formed on the surface of the silicon nitride ceramic substrate, this ceramic substrate was sandwiched between bricks containing 92% by weight of alumina and heat-treated in air at 1,300° C. for 2 hours to form an intermediate layer which was used for binding the metal circuit plate, had a thickness of 6 μm, and was composed of alumina, mullite, cristobalite, etc.

Next, a copper circuit plate made of tough pitch copper with a thickness of 0.3 mm was disposed on both surfaces of and in contact with the silicon nitride ceramic substrate on which the intermediate layer was formed. The ceramic substrate was placed in a belt-type furnace and was heated at a temperature of 1,075° C. maximum under a nitrogen atmosphere for one minute to bind the copper circuit plate with the silicon nitride ceramic substrate.

After the binding was completed, the substrate was cut off and the cutting face was subjected to a linear analysis using EPMA. As a result, the content of an alumina component in the intermediate layer was 90% by weight in the vicinity of the copper board. The content of $SiO_2$ increased with a decrease in distance from the silicon nitride ceramic substrate. The content of an alumina component in the intermediate layer was 15% by weight in the vicinity of the silicon nitride ceramic substrate.

In order to evaluate the strength characteristics and toughness, the three-point bending strength and the maximum deflection were measured in the same manner as in Example 1. As a result, the three-point bending strength was 88 kgf/mm$^2$ and the maximum deflection was 1.3 mm. Also, the peeling strength which was measured in the same manner as in Example 1 to evaluate the binding strength of the metal circuit plate was as high as 7.7 kgf/cm.

Further, a heat cycle resistance test was carried out in the same manner as in Example 1. As a result, no crack occurred in the substrate even after 1,000 cycles.

Comparative Example 1

A silicon nitride ceramic substrate was dipped in a solution of aluminum butoxide in the same manner as in Example 1 and was lifted at the same rate as in Example 1, followed by drying. This board was heat-treated at 1,400° C. in air for 2 hours without sandwiching between alumina bricks. A tough pitch copper board was bound with this ceramic substrate in the same manner as in Example 1. A certain warpage or waviness occurs in the circuit substrate. The circuit substrate was also cut off to measure the distribution of an alumina component inside the intermediate layer by EPMA linear analysis. As a result, the content of an aluminum component in the intermediate layer having a thickness of 4 μm was 78% by weight maximum at the position about 1.5 μm from the copper board. A tendency was observed in which the content of an aluminum component decreases with a decrease in distance both from the copper board and from the silicon nitride ceramic substrate. The three-point bending strength was 62 kgf/mm$^2$, the maximum deflection was 0.9 mm, and the peeling strength was 5.1 kgf/cm. All of these values are a little lower than those in Example 1. Also, because of the warpage or waviness, there were non-bound portions observed in the binding condition of the copper board. Among test samples, there were some samples which could not be practically used. The heat cycle resistance test was performed in the same manner as in Example 1 and, as a result, cracks occurred after 900 cycles exerting the problem of decreased mechanical strength.

Comparative Examples 2 to 4

Using a silicon nitride ceramic substrate produced in the same manner as in Example 3, a circuit substrate in which no intermediate layer was produced (Comparative Example 2); a circuit substrate in which the aforementioned silicon nitride ceramic substrate was heat-treated in air at 1,300° C. for 12 hours to form an oxide layer ($SiO_2$) with a thickness of 0.4 μm on the surface of the ceramic substrate (Comparative Example 3); and a circuit substrate in which an intermediate layer was formed in the same manner as in Example 3 though the thickness of the intermediate layer was 0.4 μm (Comparative Example 4) were manufactured. A copper circuit plate was bound with each of the above-mentioned circuit substrates in the same manner as in Example 3 and the adhesive strength was evaluated by a peeling strength test. As a result, the circuit substrate of Comparative Example 2 in which no intermediate layer was formed could not be bound with the copper circuit substrate. On the other hand, in the Comparative Example 3, in which the $SiO_2$ layer was formed, the peeling strength was 2.6 kgf/cm. In Comparative Example 4 in which the thickness of the intermediate layer was 0.4 μm, the peeling strength was 1.9 kgf/cm. Comparative Examples 3 and 4 had relatively low peeling strength and hence neither of these could be practically used.

Examples 4 to 7

A silicon nitride ceramic substrate was produced in the same manner as in Example 1 and each of intermediate layers composed of the various aluminate compounds shown in Table 1 was formed on the silicon nitride ceramic substrate using an alkoxide solution by the same dipping process as in Examples 1 and 3. The ceramic substrate was sandwiched between bricks containing 99% by weight of alumina and was heat-treated in air at 1,400° C. for 2 hours. As shown in Table 1, a tough pitch copper circuit plate (Examples 4 and 7), an Al circuit plate containing Si (Example 6), and a Ni circuit plate (Example 5) containing oxygen were respectively bound on the ceramic substrate by making use of an eutectic liquid phase to manufacture circuit substrates. Incidentally, the binding temperature was 585° C. maximum in Example 6 and 1,445° C. in Example 5. The peeling strength of the manufactured circuit substrate was evaluated and the heat cycle resistance test was performed to evaluate the reliability of the circuit substrate. In all of the obtained circuit substrates, the metal circuit substrate was firmly bound with the silicon nitride ceramic substrate and no crack occurred after 1,000 cycles in heat cycle resistance test.

TABLE 1

| Examples | 4 | 5 | 6 | 7 |
|---|---|---|---|---|
| Compound Containing Aluminum Oxide | $Y_3Al_5O_{12}$ | $2SiO_2 \cdot 3Al_2O_3$ | $Al_2O_3$ | $CaAl_2O_4$ |
| Intermediate Layer Thickness (μm) | 3 | 1.5 | 9 | 5 |
| Concentration of Aluminum Oxide (Wt %) | | | | |
| Silicon Nitride Side | 9 | 17 | 31 | 26 |
| Metal Side | 62 | 91 | 95 | 82 |
| Metal circuit plate | Cu | Ni | Al | Cu |
| Peeling Strength (kgf/cm) | 9.8 | 7.9 | 9.2 | 8.8 |
| Heat Cycle Resistance Test/Number of Cycles | >1000 | >1000 | >1000 | >1000 |

Example 8

To silicon nitride raw powder having an average grain size of 0.8 μm and containing 1.2% by weight of oxygen, 0.15% by weight of an impurity cation and 94% by weight of α phase-type silicon nitride were added 5% by weight of ytterbium oxide powder ($Yb_2O_3$) having an average grain size of 0.9 μm as a sintering additive, 0.9% by weight of $Al_2O_3$ powder having an average grain size of 0.6 μm, and 0.3% by weight of AlN powder having an average grain size of 0.9 μm and mixed. The mixture was molded and degreased in the same manner as in Example 1 to prepare a degreased body. Next, the degreased body was heated at 1,930° C. under a nitrogen atmosphere and a pressure of 8.5 atoms for 5 hours and successively cooled to 1,500° C. while controlling a cooling rate of 80° C./hour, followed by furnace-cooling to room temperature to produce a highly densified silicon nitride sintered body. The sintered body was subjected to a grinding process to obtain a silicon nitride ceramic substrate with a thickness of 0.6 mm. The obtained silicon nitride ceramic substrate had a porosity of 0.2% by volume. The proportion of a crystal phase in a grain boundary phase was 48% by volume. The thermal conductivity was 76 W/mK.

Next, an intermediate layer for binding a metal circuit plate with this silicon nitride ceramic substrate was formed by the following process: First, the silicon nitride ceramic substrate was washed with acetone. The washed ceramic substrate was placed in a spattering apparatus in opposition to an aluminum target to spatter aluminum in a condition of an Ar partial pressure of 0.1 Pa and an $O_2$ partial pressure of 0.2 Pa. Consequently, a thin coating of amorphous $Al_2O_3$ was produced on the silicon nitride ceramic substrate. This silicon nitride ceramic substrate on which a thin coating of amorphous $Al_2O_3$ was produced was sandwiched between bricks containing 98% by weight of alumina, was placed in a furnace, and was heat-treated in air at 1,500° C. for 30 minutes. The content of alumina contained in the intermediate layer, which was analyzed by Auger analysis, was 76% by weight in the vicinity of the surface; and the content of $SiO_2$ increased with an increase in distance from the surface of the intermediate layer so that the content of alumina was 16% by weight in the vicinity of the silicon nitride ceramic substrate.

Next, a copper circuit plate made of tough pitch copper with a thickness of 0.3 mm was disposed on both surfaces of and in contact with the obtained silicon nitride ceramic substrate. The ceramic substrate was placed in a belt-type furnace and was heated at a temperature of 1,073° C. maximum under a nitrogen atmosphere for one minute to bind the copper circuit plate with the silicon nitride ceramic substrate.

For the circuit substrate with which the copper circuit plate was bound, the measurements of the three-point bending strength and maximum deflection and the heat cycle resistance test and the peeling strength test were performed in the same manner as in Example 1. As a result, the three-point bending strength was 70 kgf/mm², the maximum deflection was 1.0 mm, no crack occurred after 1,000 cycles in the heat cycle test, and the peeling strength was 8.5 kgf/cm. All of these values were excellent and hence this circuit substrate was sufficient for applying to practical fields.

Example 9

To silicon nitride raw powder having an average grain size of 0.8 μm and containing 1.2% by weight of oxygen, 0.2% by weight of an impurity positive ion and 96% by weight of α phase-type silicon nitride were added yttrium oxide powder ($Y_2O_3$) having an average grain size of 0.9 μm as a sintering additive and alumina powder ($Al_2O_3$) having an average grain size of 0.6 μm in amounts of 3% by weight and 1.2% by weight respectively for the total amount and mixed in a wet condition in butanol for 8 hours. The mixture was dried to prepare a raw powder mixture. An acryl-type organic binder was added to the prepared raw powder mixture and mixed. Then, the resulting mixture was press-molded under a pressure of 100 MPa to prepare a molded compact of 80×50×0.9 mm. Next, the resulting molded compact was degreased at a temperature of 700° C. maximum under a nitrogen atmosphere. Then, the degreased compact was sintered at 1,850° C. under a nitrogen atmosphere and a pressure of 7 atoms for 10 hours. The sintered sample was cooled to 1,450° C. at a cooling rate of 80° C./hour, followed by furnace cooling to produce a highly densified silicon nitride sintered body. The sintered body was subjected to a grinding process to obtain a silicon nitride ceramic substrate with a thickness of 0.6 mm.

The thermal conductivity and the porosity of the manufactured silicon nitride ceramic substrate were measured. As a result, the thermal conductivity was 91 W/mK. The porosity of the silicon nitride ceramic substrate was 0.2% by volume. The proportion of a crystal phase in a grain boundary phase of the inside of the silicon nitride ceramic substrate, which was measured by a powder X ray diffraction method, was 28% by volume.

Next, the obtained silicon nitride ceramic substrate was placed in a general purpose spattering apparatus and Ti was spattered while introducing argon gas to form a thin coating of Ti with a thickness of 0.3 μm on both surfaces of the silicon nitride ceramic substrate. Then, hot water raised to 75° C. was charged into aluminum butoxide and vigorously stirred. To this liquid was added nitric acid ($HNO_3$) and stirring was further continued to prepare a semitransparent alumina sol. After the liquid was heated to remove water until the volume of this liquid was reduced by half, butanol was finally added to the liquid to produce a coating solution. The aforementioned silicon nitride ceramic substrate was dipped in this coating solution and was slowly lifted at a rate of 5 cm/minute to finish dipping in the solution, followed by air-drying. Next, this ceramic substrate was sandwiched between bricks containing 98% by weight of alumina, was placed in an electric furnace, and was heated in air at 1,250° C. for 2 hours to form an intermediate layer having a thickness of 4 μm and being composed of aluminosilicate ($Al_2O_3$–$SiO_2$) having an amorphous phase and a crystal phase, cristobalite phase ($SiO_2$) and the like on the surface of the silicon nitride ceramic substrate.

The content of alumina contained in the intermediate layer which was analyzed by EPMA analysis in section was 77% by weight in the vicinity of the surface whereas the content of $SiO_2$ increased with an increase in distance from the surface of the intermediate layer so that the content of alumina was 32% by weight in the vicinity of the silicon nitride ceramic substrate. Also, the strength of Ti increased with a decrease in distance from the silicon nitride ceramic substrate and slight segregation of Ti was observed at the boundary between the intermediate layer and the ceramic substrate.

Next, a copper circuit plate made of tough pitch copper (copper plate containing a slight amount of oxygen) with a thickness of 0.3 mm was disposed on both surfaces of the silicon nitride ceramic substrate on which the intermediate layer was formed. The ceramic substrate was placed in a belt-type furnace and was heated at a temperature of 1,073° C. maximum under a nitrogen atmosphere for one minute to bind the copper circuit plate with the silicon nitride ceramic substrate and thereby to manufacture a high thermal-conductive silicon nitride circuit substrate shown in FIG. 1.

In order to evaluate the mechanical strength and toughness of the manufactured circuit substrate, three-point bending strength and the maximum deflection were measured. In order to measure the maximum deflection, the above circuit substrate was supported with a 50 mm support span. In this condition, load was applied to the center of the circuit substrate to measure the height of deflection at the time when the circuit substrate was broken. The height of deflection at this time was defined as a maximum deflection. As a result, the three-point bending strength was 690 Mpa and the maximum deflection was 1.3 mm.

A peeling strength test was performed to evaluate the binding strength between the circuit plate made of copper and the silicon nitride ceramic substrate. In the peeling strength test, a tough pitch copper board of 0.3 mm thickness and 3 mm width was bound with a silicon nitride ceramic substrate in the same procedure as above and the end of the tough pitch copper board was peeled off in an upper direction at a right angle to the ceramic substrate using an instolon tester to measure the peeling strength. At this time, the cross head speed was 50 mm/minute. As a result, the peeling strength was 11.2 kgf/cm, showing an efficient binding strength.

Further, the circuit substrate was subjected to a heat cycle resistance test in which it was heated from −45° C. up to room temperature and successively from room temperature to 125° C. and was cooled to −45° C. in one heating cycle and this cycle was repeated. The number of cycles at the time when any crack occurred in the substrate was measured. As a result, no crack was observed in the substrate even after 1,000 cycles.

Also, a plurality of semiconductor elements were mounted on the high thermal-conductive silicon nitride circuit substrate to manufacture a semiconductor device as shown in FIG. 3. This semiconductor device was energized to measure the transient heat resistance. As a result, this semiconductor device exhibited the same heat radiation characteristics as those of a semiconductor device using a conventional aluminum nitride substrate. Also, there was no occurrence of cracks in the inside of the silicon nitride substrate and the joint portion with the copper board. Thus, excellent durability and reliability were confirmed.

Example 10

Using the same silicon nitride raw powder as in Example 9, 5% by weight of dysprosium oxide ($Dy_2O_3$) having an average grain size of 1.1 μm as a sintering aid and 0.8% by weight of aluminum nitride powder (AlN) having an average grain size of 0.6 μm were added to the raw powder and 0.3% by weight of $WO_3$ powder having an average grain size of 1.5 μm was further added. Then, molding and degreasing were performed in the same manner as in Example 9. The degreased compact was sintered at 1,900° C. under a nitrogen atmosphere and a pressure of 7 atoms for 6 hours. After the sintering, the sintered compact was cooled to 1,500° C. at a cooling rate of 50° C./hour, followed by furnace-cooling to room temperature and thereby to produce a highly densified silicon nitride sintered body. The sintered body was subjected to a grinding process to obtain a silicon nitride ceramic substrate with a thickness of 0.65 mm.

The obtained silicon nitride ceramic substrate had a porosity of 0.3% by volume. The proportion of a crystal phase in a grain boundary phase was 52% by volume. The thermal conductivity was 98 W/mK.

Next, titanium tetraethoxide ($Ti(OEt)_4$) was dissolved in ethanol used as a solvent. To the solution was added dropwise a mixture prepared by adding water and hydrochloric acid (HCl) to ethanol, and the resulting solution was refluxed. A solution in which water was dissolved in ethanol was added to the refluxed solution. Then, refluxing and stirring of the obtained solution was continued to perform partial hydrolysis and thereby to prepare a coating solution. Dropping the coating solution, a coating was formed on the surface of the silicon nitride ceramic substrate by spin coating, and the coating was dried. Next, using the same solution of aluminum butoxide as in Example 9, a coating was laminated again by spin coating.

After said two layers, namely, the layer containing titanium and the layer containing aluminum oxide, were formed on the silicon nitride ceramic substrate in this manner, this ceramic substrate was sandwiched between bricks containing 96% by weight of alumina and heat-treated at 1,300° C. for 2 hours to form an intermediate layer which was used for binding the metal circuit plate, had a thickness of 3.5 μm, and was composed of alumina, amorphous phase and the like.

Next, a copper circuit plate made of tough pitch copper with a thickness of 0.3 mm was disposed on both surfaces of and in contact with the silicon nitride ceramic substrate on which the intermediate layer was formed. The ceramic substrate was placed in a belt-type furnace and was heated at a temperature of 1,073° C. maximum under a nitrogen atmosphere for one minute to join the copper circuit plate with the silicon nitride ceramic substrate and thereby to manufacture a silicon nitride circuit plate.

The obtained circuit substrate was cut off and the cutting face was subjected to a linear analysis using EPMA. As a result, the concentration of an alumina component in the intermediate layer was 85% by weight in the vicinity of the copper board whereas the concentrations of Ti, Si, etc. increased with a decrease in a distance from silicon nitride ceramic substrate so that the concentration alumina in the intermediate layer was 28% by weight in the vicinity of the silicon nitride ceramic substrate. Also, structural phase in the intermediate layer in the vicinity of silicon nitride ceramic substrate was inspected by micro-X-ray diffraction and, as a result, the existence of $Ti_5Si_3$ was confirmed.

In order to evaluate the strength characteristics and toughness, the three-point bending strength and the maximum deflection were measured in the same manner as in Example 9. As a result, the three-point bending strength was 880 MPa and the maximum deflection was 1.2 mm. Also, a peeling strength which was measured in the same manner as in Example 9 to evaluate the binding strength of the metal circuit plate was as high as 10.7 kgf/cm. Further, a heat cycle resistance test was carried out in the same manner as in Example 9. As a result, no crack occurred in the substrate even after 1,000 cycles.

Comparative Example 5

Solutions of titanium tetraethoxide and aluminum butoxide were prepared, both solutions were mixed and stirred, then the mixed solution was refluxed in the same manner as in Example 10 to prepare a semitransparent solution for dipping. A silicon nitride ceramic substrate produced in the same manner as in Example 9 was dipped in the resulting solution and was then lifted, followed by drying. The same heat treatment as in Example 10 was performed except that the silicon nitride ceramic substrate was not sandwiched by alumina bricks. Then, a metal circuit plate made of tough pitch copper was bound with the silicon nitride ceramic substrate to manufacture a silicon nitride circuit substrate.

In order to evaluate the strength characteristics and toughness, the three-point bending strength and the maximum deflection were measured. As a result, the three-point bending strength was as high as 860 MPa and the maximum deflection was as high as 1.2 mm. However, a peeling strength which was measured to evaluate the binding strength of the metal circuit plate was as low as 4.6 kgf/cm. Therefore, this circuit substrate was not sufficient to be applied to practical circuit substrates on which semiconductor was mounted. Also, the peeling mode of the metal circuit plate was investigated and, as a result, it was confirmed that peeling occurred between the intermediate layer and the silicon nitride ceramic substrate. The composition of the inside of the intermediate layer was analyzed using EPMA. As a result, the concentration of aluminum oxide and the content of titanium in the intermediate layer were uniform and the structural phase of the intermediate layer was almost Ti-Al-O.

Comparative Example 6

An intermediate layer was formed in the same manner as in Example 9 except that the metal first spattered on the silicon nitride ceramic substrate using a spattering apparatus was not Ti but Zr. After the heat-treatment was finished, a metal circuit plate made of a tough pitch copper board was bound with the silicon nitride ceramic substrate to a silicon nitride circuit substrate.

In order to evaluate the strength characteristics and toughness of the obtained circuit plate, the three-point bending strength and the maximum deflection were measured. As a result, the three-point bending strength was 710 MPa and the maximum deflection was 1.1 mm.

A peeling strength which was measured to evaluate the binding strength between circuit plate made of copper and the silicon nitride ceramic substrate was 3.3 kgf/cm. The binding strength was relatively low. Further, the circuit substrate was subjected to a heat cycle resistance test in which it was heated from −45° C. up to room temperature and successively from room temperature to 125° C., and was cooled to −45° C. via room temperature in one heating cycle and this cycle was repeated. The number of cycles at the time when any crack occurred in the substrate was measured. As a result, it was confirmed that the silicon nitride ceramic substrate peeled from the silicon nitride ceramic substrate after 150 cycles and hence this circuit substrate was not sufficient for practical use. Also, the peeling mode was investigated and, as a result, it was estimated that the binding strength between a layer containing zirconium and the silicon nitride ceramic substrate was low, which causes the disorder in the heat cycle test.

Example 11 to 14

A silicon nitride ceramic substrate was produced in the same manner as in Example 9. A Ti layer with a thickness of 0.5 μm and for binding a metal circuit plate was formed on the surface of the silicon nitride ceramic substrate by spattering in the same manner as in Example 9. An alkoxide solution of each of the various aluminate compounds shown in Table 2 was applied to the Ti layer by spin coating in the same manner as in Example 10. The resulting ceramic substrate was sandwiched between bricks containing 98% by weight of alumina and was heat-treated at 1,300° C. under the prescribed atmosphere shown in Table 2. As shown in Table 2, further, a tough pitch copper board (Example 11), Al circuit plate containing Si (Example 12), Ni circuit plate containing oxygen (Example 13), and copper board produced by slightly oxidizing the surface of a oxygen free copper (Example 14) were respectively bound with the surface of the ceramic substrate by making use of an eutectic liquid phase to manufacture a circuit substrate. Incidentally, the binding temperature was 585° C. maximum in Example 12 and 1,445° C. maximum in Example 13.

A measurement of the peeling strength and the heat cycle test for each of the prepared circuit substrates were performed to evaluate the reliability. The results are shown in Table 2.

TABLE 2

| Examples | 11 | 12 | 13 | 14 |
|---|---|---|---|---|
| Compound Containing Aluminum Oxide | 2SiO$_2$.3Al$_2$O$_3$ | Y$_3$Al$_5$O$_{12}$ | CaAl$_2$O$_4$ | Al$_2$O$_3$ |
| Heat Treating Atmosphere | air | N$_2$ : 90% O$_2$ : 10% | air | N$_2$ : 93% O$_2$ : 7% |
| Intermediate Layer Thickness (μm) | 2.1 | 1.2 | 5 | 8 |
| Concentration of Aluminum Oxide (Wt %) | | | | |
| Silicon Nitride Side | 25 | 38 | 22 | 41 |
| Metal Side | 81 | 68 | 78 | 97 |
| Metal circuit plate | Cu | Al | Ni | Cu |
| Peeling Strength (kgf/cm) | 9.6 | 9.8 | 8.8 | 9.2 |
| Heat Cycle Resistance Test/Number of Cycles | >1000 | >1000 | >1000 | >1000 |

As is evident from Table 2, in all of the circuit substrates prepared in Examples 11 to 14, the metal circuit plate was firmly bound with the silicon nitride ceramic substrate and no crack occurred even after 1,000 cycles in the heat cycle resistance test.

Example 15

To silicon nitride raw powder having an average grain size of 0.7 μm and containing 1.0% by weight of oxygen, 0.2% by weight of an impurity positive ion and 94% by weight of a phase-type silicon nitride were added 6% by weight of ytterbium oxide powder (Yb$_2$O$_3$) having an average grain size of 1.0 μm as a sintering additive, 0.5% by weight of alumina powder (Al$_2$O$_3$) having an average grain size of 0.5 μm and 0.3% by weight of aluminum nitride powder (AlN) having an average grain size of 0.6 μm and mixed. The mixture was molded and degreased in the same manner as in Example 9 to prepare a degreased body. Next, the degreased compact was sintered at 1,900° C. under a nitrogen atmosphere and a pressure of 7.5 atoms for 6 hours and successively cooled to 1,500° C. while controlling a cooling rate of 100° C./hour, followed by furnace-cooling to room temperature to produce a highly densified silicon nitride ceramic substrate.

The obtained silicon nitride ceramic substrate had a porosity of 0.2% by volume. The proportion of a crystal phase in a grain boundary phase was 45% by volume. The thermal conductivity was 85 W/mK.

Next, an alcohol solution in which titanium chloride (TiCl$_3$) was dissolved in ethanol was applied to the silicon nitride ceramic substrate by spin coating and was dried to precipitate microcrystals of TiCl$_3$ with a thickness of 1.5 μm on the silicon nitride ceramic substrate. The silicon nitride ceramic substrate was placed in a spattering apparatus in opposition to an aluminum target to spatter aluminum in a condition of an Ar partial pressure of 0.1 Pa and an O$_2$ partial pressure of 0.2 Pa. Consequently, a thin coating of amorphous Al$_2$O$_3$ was produced on the silicon nitride ceramic substrate. This silicon nitride ceramic substrate on which the Ti compound and the thin coating of amorphous Al$_2$O$_3$ were produced was sandwiched between bricks containing 98% by weight of alumina, was placed in a furnace, and was heat-treated in air at 1,500° C. for 20 minutes.

The content of alumina contained in the intermediate layer (3 μm) formed on the surface of the silicon nitride ceramic substrate was analyzed. As a result, the content of alumina was 82% by weight in the vicinity of the surface, decreased with an increase in distance from the surface of the intermediate layer, and was 23% by weight in the vicinity of the silicon nitride ceramic substrate. Also, it was confirmed that Ti tended to segregate in the vicinity of the silicon nitride ceramic substrate.

Next, a copper circuit plate made of tough pitch copper with a thickness of 0.3 mm was disposed on both surfaces of and in contact with the obtained silicon nitride ceramic substrate. The ceramic substrate was placed in a belt-type furnace and was heated at a temperature of 1,072° C. maximum under a nitrogen atmosphere for one minute to bind the copper circuit plate with the silicon nitride ceramic substrate and thereby to manufacture a silicon nitride circuit substrate.

For the circuit substrate, the strength and toughness were evaluated. As a result, the three-point bending strength was 770 MPa, the maximum deflection was 1.3 mm, no crack occurred after 1,000 cycles in the heat cycle resistance test, and the peeling strength was 9.8 kgf/cm. All of these values were excellent and hence this circuit substrate was sufficiently applied to practical fields.

Example 16

To silicon nitride raw powder having an average grain size of 0.7 μm and containing 1.0% by weight of oxygen, 0.4% by weight of an impurity cation and 92% by weight of α phase-type silicon nitride were added yttrium oxide powder ($Y_2O_3$) having an average grain size of 1.0 μm as a sintering additive and alumina powder ($Al_2O_3$) having an average grain size of 0.8 μm in amounts of 4% by weight and 0.9% by weight respectively for the total amount and mixed in a wet condition in butanol for 8 hours. The mixture was dried to prepare a raw powder mixture. An acryl-type organic binder was added to the prepared raw powder mixture and mixed. Then, the resulting mixture was press-molded under a pressure of 100 MPa to prepare a molded compact of 80×50×0.9 $mm^3$. Next, the resulting molded compact was degreased at a temperature of 700° C. maximum under a nitrogen atmosphere. Then, the degreased compact was sintered at 1,880° C. under a nitrogen atmosphere and a pressure of 8 atoms for 8 hours. The sintered sample was cooled to 1,450° C. at a cooling rate of 60° C./hour, followed by furnace cooling to produce a highly densified silicon nitride sintered body. The sintered body was subjected to a grinding process to obtain a silicon nitride ceramic substrate with a thickness of 0.6 mm.

The thermal conductivity of the manufactured silicon nitride ceramic substrate were measured. As a result, the thermal conductivity was 91 W/mK. The porosity of the silicon nitride ceramic substrate was 0.2% by volume. The proportion of a crystalline phase in a grain boundary phase of the inside of the silicon nitride ceramic substrate, which was measured by a powder X ray diffraction method, was 45% by volume.

Next, hot water raised to 75° C. was charged into aluminum butoxide and vigorously stirred. Then, to this solution was added nitric acid ($HNO_3$), followed by continued mixing to obtain a semitransparent alumina sol. After this liquid was heated to remove water until the volume of this liquid was reduced by half, butanol was finally added to the liquid to produce a coating solution. The aforementioned silicon nitride ceramic substrate was dipped in this coating solution and was slowly lifted at a rate of 5 cm/minute to finish dipping in the solution, followed by air-drying. Next, this ceramic substrate was sandwiched between bricks containing 96% by weight of alumina, was placed in an electric furnace, and was heated in air at 1,550° C. for 2 hours to form, on the silicon nitride ceramic substrate, an intermediate layer having a thickness of 4 μm and being composed of alumina, sialon (Si-Al-O-N), and the like. The content of alumina contained in the intermediate layer which was analyzed by EPMA analysis in section was 83% by weight in the vicinity of the surface whereas the contents of nitrogen and Si increased with an increase in distance from the surface of the intermediate layer so that the content of alumina was 44% by weight in the vicinity of the silicon nitride ceramic substrate.

Next, a copper circuit plate made of tough pitch copper (copper plate containing a slight amount of oxygen) with a thickness of 0.3 mm was disposed on both surfaces of the silicon nitride ceramic substrate on which the intermediate layer was formed. The ceramic substrate was placed in a belt-type furnace and was heated at a temperature of 1,073° C. maximum under a nitrogen atmosphere for one minute to bind the copper circuit plate with the silicon nitride ceramic substrate and thereby to manufacture a high thermal-conductive silicon nitride circuit substrate shown in FIG. 1.

In order to evaluate the mechanical strength and toughness, the manufactured circuit substrate was subjected to the three-point bending strength and the maximum deflection were measured in the same manner as in Example 9. As a result, the three-point bending strength was 720 Mpa and the maximum deflection was 1.2 mm.

A peeling strength test was performed in the same manner as in Example 9 to evaluate the binding strength between the circuit plate made of copper and the silicon nitride ceramic substrate. As a result, the peeling strength was 10.8 kgf/cm, showing an sufficient binding strength.

Further, the circuit substrate was subjected to a heat cycle resistance test in which it was heated from −45° C. up to room temperature and successively from room temperature to 125° C. and was cooled to −45° C. in one heating cycle, and this cycle was repeated. The number of cycles at the time when any crack occurred in the substrate was measured. As a result, no crack was observed in the substrate even after 1,000 cycles.

Also, a plurality of semiconductor elements was mounted on the high thermal-conductive silicon nitride circuit substrate to manufacture a semiconductor device as shown in FIG. 3. This semiconductor device was energized to measure the transient heat resistance. As a result, this semiconductor device exhibited the excellent heat radiation characteristics same as those of a semiconductor device using a conventional aluminum nitride substrate. Also, there was no occurrence of cracks in the inside of the silicon nitride substrate and the binding portion with the copper board. Thus, excellent durability and reliability were confirmed.

Example 17

Using the same silicon nitride raw powder as in Example 16, 5% by weight of dysprosium oxide ($Dy_2O_3$) having an average grain size of 1.1 μm as a sintering assistant and 0.8% by weight of aluminum nitride powder (AlN) having an average grain size of 0.6 μm were added to the raw powder and 0.3% by weight of $WO_3$ powder having an average grain size of 1.5 μm was further added. Then, molding and degreasing were performed in the same manner as in Example 16. The degreased compact was sintered at 1,900°

C. under a nitrogen atmosphere and a pressure of 7 atoms for 6 hours. After the baking, the baked compact was cooled to 1,500° C. at a cooling rate of 50° C./hour, followed by furnace-cooling to room temperature and thereby to produce a highly densified silicon nitride sintered body. The sintered body was subjected to a grinding process to obtain a silicon nitride ceramic substrate with a thickness of 0.65 mm.

The obtained silicon nitride ceramic substrate had a porosity of 0.3% by volume. The proportion of a crystal phase in a grain boundary phase was 55% by volume. The thermal conductivity was 98 W/mK.

Then, the silicon nitride ceramic substrate was placed in a spattering apparatus in opposition to a titanium target to spatter titanium in a condition of an Ar partial pressure of 0.1 Pa and an $O_2$ partial pressure of 0.2 Pa and thereby to form a thin coating of TiN on both sides of the silicon nitride ceramic substrate. Then, the same solution of aluminum butoxide as in Example 16 was used to laminate a coating by spin coating.

After two layers, specifically, the layer containing titanium and the layer containing aluminum oxide were formed on the silicon nitride ceramic substrate in this manner, this ceramic substrate was sandwiched between bricks containing 96% by weight of alumina and heat-treated at 1,600° C. for 30 minutes in a nitrogen atmosphere involving 5% of oxygen to form an intermediate layer which was used for binding the metal circuit plate, had a thickness of 3.5 μm, and was composed of alumina, TiN, $Ti_5Si_3$, sialon and the like.

Next, a copper circuit plate made of tough pitch copper with a thickness of 0.4 mm was disposed on both surfaces of and in contact with the silicon nitride ceramic substrate on which the intermediate layer was formed. The ceramic substrate was placed in a belt-type furnace and was heated at a temperature of 1,073° C. maximum under a nitrogen atmosphere for one minute to bind the copper circuit plate with the silicon nitride ceramic substrate and thereby to manufacture a silicon nitride circuit plate.

The obtained substrate was cut off and the cutting face was subjected to a linear analysis in section using EPMA. As a result, the concentration of an alumina component in the intermediate layer was 85% by weight in the vicinity of the copper plate whereas the concentrations of nitrogen and Si increased with a decrease in distance from the silicon nitride ceramic substrate so that the concentration of alumina in the intermediate layer was 28% by weight in the vicinity of the silicon nitride ceramic substrate.

In order to evaluate the strength characteristics and toughness, the three-point bending strength and the maximum deflection were measured in the same manner as in Example 16. As a result, the three-point bending strength was 780 MPa and the maximum deflection was 1.2 mm.

Also, a peeling strength which was measured in the same manner as in Example 16 to evaluate the binding strength of the metal circuit plate was as high as 10.5 kgf/cm. Further, a heat cycle resistance test was carried out in the same manner as in Example 9. As a result, no crack occurred in the substrate even after 1,000 cycles.

Comparative Example 7

A solution of aluminum butoxide was prepared to obtain a semitransparent solution for dipping in the same manner as in Example 16. Then, a silicon nitride ceramic substrate produced in the same manner as in Example 16 was dipped in the resulting solution and was then lifted, followed by drying. The same heat treatment as in Example 16 was performed except that the heating temperature was altered to 1,350° C. Then a metal circuit plate made of tough pitch copper was bound with the silicon nitride ceramic substrate to manufacture a silicon nitride circuit substrate.

In order to evaluate the strength characteristics and toughness, the three-point bending strength and the maximum deflection were measured. As a result, the three-point bending strength was as high as 860 MPa and the maximum deflection was as high as 1.2 mm. However, a peeling strength which was measured to evaluate the binding strength of the metal circuit plate was as low as 4.3 kgf/cm. Therefore, this circuit substrate could not be applied to practical circuit substrates on which semiconductors were mounted. Also, the peeling mode of the metal circuit plate was investigated and, as a result, it was confirmed that peeling occurred between the intermediate layer and the silicon nitride ceramic substrate. The composition of the inside of the intermediate layer was analyzed using EPMA. As a result, the concentration of an alumina component in the intermediate layer was slightly higher in the vicinity of the surface of the intermediate layer and decreased with a decrease in distance from the silicon nitride ceramic substrate. There was almost no nitrogen contained in the inside of the intermediate layer. The investigation of a peeling mode after the peeling test clarified that peeling occurred between the intermediate layer and the silicon nitride ceramic substrate. It was predicted that the adhesive strength between the intermediate layer and the silicon nitride ceramic substrate was low.

Example 18 to 21

A silicon nitride ceramic substrate was produced in the same manner as in Example 16. An intermediate layer composed of each of the various aluminate compounds shown in Table 3 was formed on the silicon nitride ceramic substrate using an alkoxide solution by spin coating in the same manner as in Example 17. The resulting ceramic substrate was sandwiched between bricks containing 98% by weight of alumina and was heat-treated in the prescribed atmospheric and temperature conditions shown in Table 3. As shown in Table 3, further, an Al circuit plate containing Si (Example 18), a tough pitch copper board (Example 19), a copper board produced by slightly oxidizing the surface of a oxygen free copper (Example 20) and a Ni circuit plate containing oxygen (Example 21) were respectively bound with the surface of the silicon nitride ceramic substrate by making use of an eutectic liquid phase to manufacture a silicon nitride circuit plate. Incidentally, the binding temperature was 585° C. maximum in Example 18 and 1,445° C. maximum in Example 21.

A measurement of the peeling strength and the heat cycle test for each of the prepared circuit substrates were performed to evaluate the reliability. The results are shown in Table 3.

TABLE 3

| Examples | 18 | 19 | 20 | 21 |
|---|---|---|---|---|
| Compound Containing Aluminum Oxide | $Y_3Al_5O_{12}$ | $2SiO_2.3Al_2O_3$ | $Al_2O_3$ | $CaAl_2O_4$ |
| Heat Treatment | | | | |
| Temperature (°C.) | 1450 | 1500 | 1550 | 1480 |
| Atmosphere | $N_2$ : 90% $O_2$ : 10% | $N_2$ | $N_2$ : 93% $O_2$ : 7% | $N_2$ |

TABLE 3-continued

| Examples | 18 | 19 | 20 | 21 |
|---|---|---|---|---|
| Intermediate Layer Thickness (μm) | 1.0 | 2.5 | 9 | 4 |
| Concentration of Aluminum Oxide (Wt %) | | | | |
| Silicon Nitride Side | 48 | 58 | 66 | 52 |
| Metal Side | 62 | 85 | 95 | 82 |
| Metal circuit plate | Al | Cu | Cu | Ni |
| Peeling Strength (kgf/cm) | 10.5 | 9.6 | 12.1 | 8.8 |
| Heat Cycle Resistance Test/Number of Cycles | >1000 | >1000 | >1000 | >1000 |

As is evident from Table 3, in all of the circuit substrates prepared in Examples 18 to 21, the metal circuit plate was firmly bound with the silicon nitride ceramic substrate and no crack occurred even after 1,000 cycles in the heat cycle resistance test.

Example 22

To silicon nitride raw powder having an average grain size of 0.7 μm and containing 1.0% by weight of oxygen, 0.2% by weight of an impurity positive ion and 94% by weight of α phase-type silicon nitride were added 6% by weight of ytterbium oxide powder ($Yb_2O_3$) having an average grain size of 1.0 μm as a sintering assistant, 0.5% by weight of alumina powder ($Al_2O_3$) having an average grain size of 0.5 μm and 0.3% by weight of aluminum nitride powder (AlN) having an average grain size of 0.6 μm and mixed in a wet condition in n-butanol using a ball mill. The mixed powder was dispersed in an organic solvent together with an organic binder. The obtained slurry was formed into a sheet by a doctor blade process to manufacture a plurality of green sheets. The prepared green sheet was cut into sheets of 80×40 mm² and the plurality of sheets are laminated to prepare a formed compact having a thickness of 0.8 mm. The compact was degreased to obtain a degreased body. The degreased body was heated at 1,900° C. under a nitrogen atmosphere and a pressure of 7.5 atoms for 6 hours and successively cooled to 1,500° C. while controlling a cooling rate of 100° C./hour, followed by furnace-cooling to room temperature to produce a highly densified silicon nitride ceramic substrate.

The obtained silicon nitride ceramic substrate had a porosity of 0.2% by volume. The proportion of a crystal phase in a grain boundary phase was 45% by volume. The thermal conductivity was 85 W/mK.

Next, the silicon nitride ceramic substrate was placed in a spattering apparatus in opposition to an aluminum target to spatter aluminum in a condition of an Ar partial pressure of 0.1 Pa and an $O_2$ partial pressure of 0.2 Pa. Consequently, a thin film of amorphous $Al_2O_3$ with a thickness of 2.5 μm was produced on the silicon nitride ceramic substrate. This silicon nitride ceramic substrate on which the thin coating of amorphous $Al_2O_3$ was produced was sandwiched between bricks containing 98% by weight of alumina, was placed in a furnace, and was heat-treated in air at 1,550° C. for 20 minutes. The content of alumina contained in the intermediate layer (4.5 μm) formed on the surface of the silicon nitride ceramic substrate was analyzed. As a result, the content of a alumina was 82% by weight in the vicinity of the surface, decreased with an increase in distance from the surface of the intermediate layer, and was 23% by weight in the vicinity of the silicon nitride ceramic substrate.

Next, a copper circuit plate made of tough pitch copper with a thickness of 0.4 mm was disposed on both surfaces of and in contact with the obtained silicon nitride ceramic substrate. The ceramic substrate was placed in a belt-type furnace and was heated at a temperature of 1,072° C. maximum under a nitrogen atmosphere for one minute to bind the copper circuit plate with the silicon nitride ceramic substrate and thereby to manufacture a silicon nitride circuit substrate.

For the circuit substrate, the strength and toughness were evaluated. As a result, the three-point bending strength was 770 MPa, the maximum deflection was 1.3 mm, no crack occurred after 1,000 cycles in the heat cycle resistance test, and the peeling strength was 9.8 kgf/cm. All of these values were excellent and hence this circuit substrate was sufficiently applied to practical fields.

As is evident from the aforementioned explanations, in the silicon nitride circuit substrate according to the present invention, an intermediate layer including a compound containing an aluminum oxide component is formed on the surface of a high thermal-conductive silicon nitride ceramic substrate and a concentration gradient of aluminum oxide is intentionally produced to bind metal circuit plate in an integrated manner. Therefore, a reliable circuit substrate can be obtained so that cracks of the circuit substrate caused by fastening never occur in an assembling process. A semiconductor device can be manufactured using this circuit substrate at a high production yield. Also, because the toughness of a silicon nitride ceramic substrate is high, occurrences of cracks caused by a heat cycle in the ceramic substrate can be restrained whereby the heat cycle-resistant characteristics can be significantly improved. Therefore, a semiconductor device having excellent durability and reliability can be provided. Further, by using a silicon nitride ceramic substrate having outstandingly high thermal conductivity, the deterioration in heat resistance is small, even if semiconductor elements with high output power are mounted, exhibiting high heat radiation. Also, the silicon nitride ceramic substrate itself has excellent mechanical strength so that the thickness of a ceramic substrate required to satisfy the given mechanical characteristics can be more reduced than in the case of using other materials. The feature in which the thickness of a ceramic substrate can be more reduced than in the case of using other materials ensures reduced heat resistance and enables the heat radiation characteristics to be further improved. This feature also makes possible to attain high density mounting and minimization of a semiconductor device.

It must be understood that the invention is in no way limited to the above embodiments and that many changes may be brought about therein without departing from the scope of the invention as defined by the appended claims.

What is claimed is:

1. A silicon nitride circuit substrate, comprising:
    a silicon nitride substrate;
    a metal circuit plate; and
    an intermediate layer being interposed between the silicon nitride substrate and the metal circuit plate for joining the silicon nitride substrate and the metal circuit plate, and having a compound containing an aluminum oxide component, in which the concentration of the aluminum oxide component in the intermediate layer is higher in the side of the metal circuit plate than in the side of the silicon nitride substrate, and wherein the concentration of the aluminum oxide component in the side of the metal circuit plate is 40% by weight or more.

2. The silicon nitride circuit substrate of claim 1, wherein the thickness of the intermediate layer is within a range of 0.5 to 15 µm.

3. The silicon nitride circuit substrate of claim 1, wherein the compound containing an aluminum oxide component includes a substance which is selected from the group consisting of alumina, aluminosilicate and rare earth aluminate, and the aluminosilicate includes mullite, and the aluminum oxide component forms a M-Al-O compound wherein the M represents a metal component composing the metal circuit plate.

4. The silicon nitride circuit substrate of claim 1, wherein the intermediate layer contains a compound containing a titanium component so that the concentration of the titanium component in the intermediate layer is higher in the side of the silicon nitride substrate than in the side of the metal circuit plate.

5. The silicon nitride circuit substrate of claim 4, wherein the titanium component of the intermediate layer forms a titanium-aluminum compound or a titanium-silicon compond, in which the titanium-aluminum compound includes $TiAl_3$ and $Ti_2AlN$ and the titanium-silicon compound cinludes $Ti_5Si_3$.

6. The silicon nitride circuit substrate of claim 1, wherein the intermediate layer contains a nitrogen component in such a manner that the concentration of the nitrogen component in the intermediate layer is higher in the side of the silicon nitride substrate than in the side of the metal circuit plate.

7. The silicon nitride circuit substrate of claim 1, wherein the silicon nitride substrate has a grain boundary phase such that 20% by volume or more of the grain boundary phase is a crystal phase, and the silicon nitride substrate has a porosity of 1.5% by volume or less, a heat conductivity of 60 W/mK or more at 25° C. and a three-point bending strength of 60 $kgf/mm^2$ or more.

8. The silicon nitride circuit substrate of claim 1, wherein the silicon nitride substrate contains a rare earth element in an amount of 1.0 to 12.5% by weight converted into an oxide, and an impurity positive ion elements which includes Li, Na, K, Fe, Ca, Mg, Sr, Ba, Mn and B is contained in the silicon nitride substrate in a total amount of less than 0.3% by weight.

9. A semiconductor device, comprising:

a silicon nitride circuit substrate, comprising:
  a silicon nitride substrate;
  a metal circuit plate; and
  an intermediate layer being interposed between the silicon nitride substrate and the metal circuit plate for bonding the silicon nitride substrate and the metal circuit plate, and having a compound containing an aluminum oxide component, in which the concentration of the aluminum oxide component in the intermediate layer is higher in the side of the metal circuit plate than in the side of the silicon nitride substrate, and wherein the concentration of the aluminum oxide component in the side of the metal circuit plate is 40% by weight or more; and a semiconductor element which is mounted on the silicon nitride circuit substrate.

* * * * *